United States Patent [19]
Klatskin et al.

[11] 3,932,226
[45] Jan. 13, 1976

[54] METHOD OF ELECTRICALLY INTERCONNECTING SEMICONDUCTOR ELEMENTS

[75] Inventors: Jerome Barnard Klatskin, Princeton Junction; Arye Rosen, Cherry Hill, both of N.J.

[73] Assignee: RCA Corporation, New York, N.Y.

[22] Filed: Dec. 6, 1974

[21] Appl. No.: 530,401

[52] U.S. Cl. ...................... 204/16; 29/589; 204/15
[51] Int. Cl.² .......................................... C25D 5/02
[58] Field of Search ........ 204/3, 15, 16, 23; 29/589, 29/591, 628

[56] References Cited
UNITED STATES PATENTS
| | | | |
|---|---|---|---|
| 3,514,378 | 5/1970 | MacDougall | 204/3 |
| 3,859,180 | 1/1975 | Hasty | 204/16 |

*Primary Examiner*—T. M. Tufariello
*Attorney, Agent, or Firm*—H. Christoffersen; R. P. Williams

[57] ABSTRACT

An improved method of electrically interconnecting a plurality of spaced semiconductor elements adjacent to a substrate, each element having a mesa shape with a top surface spaced apart from the substrate and a side surface, includes coating the side surfaces of the elements with a protective material, filling in the space above the substrate and in between the elements with a temporary support material, depositing a continuous electrically-conductive layer on the support material and in electrical contact with the top surfaces of a plurality of the elements, and then removing the temporary support material to form an electrically-conductive homogeneous air-bridge. The protective material protects the elements from being exposed to the temporary support material. By this method, a plurality of metallized air-bridges can be formed simultaneously.

10 Claims, 9 Drawing Figures

METHOD OF ELECTRICALLY INTERCONNECTING SEMICONDUCTOR ELEMENTS

The invention herein described was made in the course of or under a contract or subcontract thereunder with the Department of the Army.

This invention relates to an improved method of electrically interconnecting a plurality of semiconductor elements to form an electrically-conductive homogeneous air-bridge. This method can be used to form simultaneously a plurality of electrically-conductive air-bridges.

The temperature rise of a semiconductor device, such as an avalanche diode, is often a critical factor in limiting device performance and can ultimately lead to temperatures high enough to cause device failure. In order to reduce the temperature rise while maintaining a large power output, a semiconductor device sometimes takes the form of a semiconductor array having a plurality of elements connected in parallel, such as an array of several diodes where the diameter of each diode in the array is small enough so that thermal spreading will limit the temperature rise and the diode to diode spacing is large enough so that the thermal spreading of one diode does not overlap with that of an adjacent diode. The reason for a limited temperature rise in such an array is that thermal spreading occurs at the diode edge. The greater the thermal spreading, the lower will be the temperature of the diode, therefore the more "edge" a diode has, the lower will be the temperature of operation. The multiple-diode array presents a configuration which can have a greater periphery to area ratio than circular ring structures or stripe geometries, and thus can have a lower thermal resistance.

Such a multiple-diode array is typically manufactured by first doping a semiconductor wafer with conductivity modifiers to form a desired structure for the elements. Metal films are then deposited on both sides of the wafer using a conventional deposition process such as, for example, vacuum sputtering. A layer of metal having good thermal and electrical conductivity is formed adjacent to one of the metal films in order to provide structural support for the elements, act as one of two element-connecting electrodes, and also serve as a heat sink for the elements. The other metal film is selectively etched to form an array of metallic contacts, which is then used as a mask for etching away portions of the wafer to form mesa-shaped diodes.

The multiple-diode array is completed by forming the other element-connecting electrode which interconnects the metallic contacts. Various bonding techniques have been used for electrically interconnecting the elements such as, for example, wire stitch-bonding or "flip-chip" bonding where a metal plate is thermally bonded to the metallic contacts. Such techniques, which form metallized air-bridges, minimize the parasitic shunt capacitance of the structure since the element-connecting electrodes are separated by an air dielectric rather than a solid dielectric such as, for example, silicon dioxide. In addition, the use of a metal plate serves as an integral heat capacitor for the elements while providing low inductance interconnections. However, such techniques not only result in low yield due to a lack of reproducible uniformity but also are lacking in efficiency and economy due to the fact that such techniques are not readily suitable for mass production.

Figure 1:
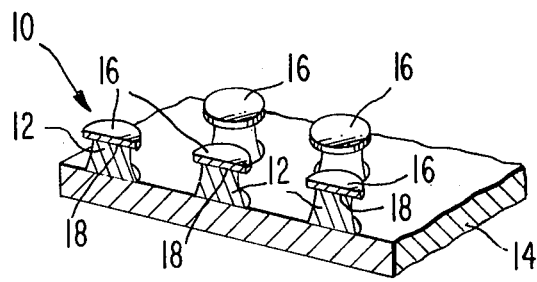
FIG. 1 is a partial perspective view illustrating a typical semiconductor array having a plurality of elements which are subsequently interconnected by using the present novel method.

Referring to FIG. 1 of the drawings, there is shown a portion of a typical semiconductor array 10 having a plurality of elements 12 such as, for example, mesa-shaped diodes manufactured by the procedure described above. Each of the elements 12 is adjacent to a substrate 14 made of, for example, gold, is spaced apart from each other, has a side surface, and has a cap of electrically-conductive material, typically a metallic contact 16 of, for example, gold, covering and, in this example, extending beyond a top surface 18 thereof spaced apart from the substrate 14. The extension of the contacts 16 is the result of the etching step used to define the mesa-shaped diodes. The etchant typically undercuts the contacts 16.

Figure 2:
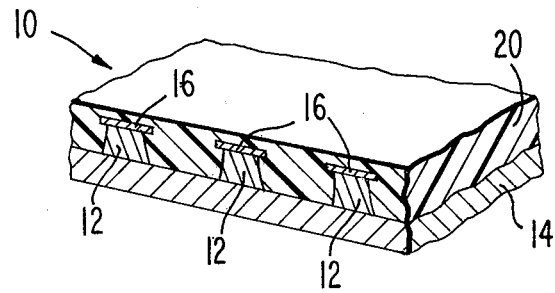
FIGS. 2 to 8 are partial perspective views showing a series of steps illustrating the present novel method of electrically interconnecting the elements of the array illustrated in FIG. 1.

The elements 12 of the array are electrically interconnected by the present novel method of which the preferred embodiment is illustrated in FIGS. 2 to 8, thereby forming the second interconnecting electrode of the multi-diode array 10. The preferred method begins by coating the side surfaces of the elements 12 with a protective material which may comprise any material capable of effectively protecting the semiconductor elements 12, especially exposed PN junctions disposed therein, from a temporary support material which is subsequently filled into the space between the elements 12. This protective material is disposed adjacent the elements 12 under edges of the contacts 16, and may be applied by any feasible means. In the preferred embodiment, this coating step is performed, as shown in FIG. 2, by applying on the substrate 14, which is gold in the present example, a layer 20 of positive photoresist in contiguous surrounding relation to the elements 12 of the array 10. Preferably, the photoresist layer 20 has thickness at least slightly greater than the height of the metallic contacts 16 above the substrate 14 so that the photoresist layer 20 is in contiguous surrounding relation to both the elements 12 and the contacts 16 of the array 10, and consequently can be utilized to prevent not only the elements 12 but also parts of the contacts 16 from being exposed to a first layer of material which is deposited in a subsequent step. The material of the photoresist layer 20 is a positive-acting material, that is, it is one which, on development, will remain where it is not illuminated. Such materials are well known and commerically available.

Figure 3:
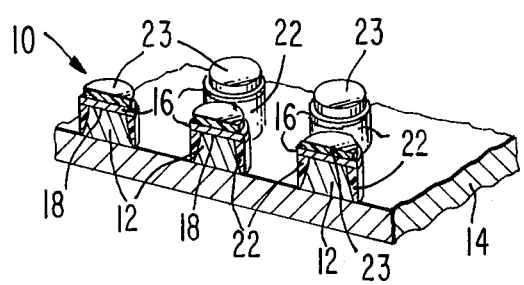

By subjecting portions of the photoresist layer 20 to a collimated light source directed substantially normal to the surface of the substrate 14, utilizing a dot-pattern mask of opaque dots which overlie and are slightly smaller than the contacts 16 and also utilizing the contacts 16 as a light mask, and then developing the light-subjected portions of the photoresist layer 20 using conventional photolithographic processes, light-protected portions of the photoresist layer 20 remain, as shown in FIG. 3. Such light-protected portions comprise portions 22 lying adjacent the sides of the elements 12 under the edges of the contacts 16 and also portions 23 lying above parts of the contacts 16, thereby effectively preventing the PN junctions and parts of the contacts 16 from being exposed to the subsequently deposited first layer of material. By utilizing opaque dots, which are slightly smaller than the contacts 16, to partially mask the photoresist layer 20, portions of the contacts 16 are left exposed so that the subsequently deposited first layer can physically touch the contacts 16. This is necessary if a deposition technique such as, for example, electrolysis is used in a subsequent step for electrically interconnecting the elements 12.

Figure 4:
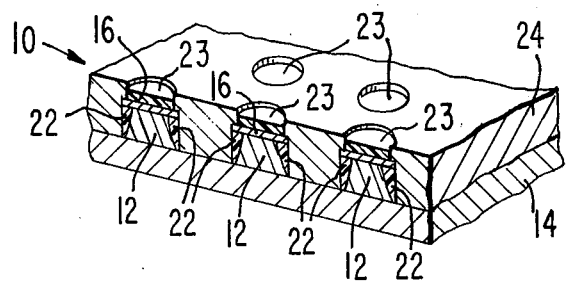

The next step of the method comprises filling in the space above the substrate 14 and in between the elements 12 with a temporary support material 24 different from the material of the substrate 14 and contacts 16, and being capable of removal without affecting the substrate 14 or contacts 16. Preferably, this temporary support material 24 is metal and this step is performed by electroplating the material 24 on the substrate 14 in surrounding relation to the elements 12 and the metallic contacts 16, as shown in FIG. 4. This temporary support material 24, preferably, is copper which is easily removed by etching in an ultrasonic etch bath of ferric chloride solution, and has a thickness at least equal to the height of the contacts 16 above the substrate 14 to enable a subsequently-deposited second layer of electrically-conductive material to be easily electroplated on both the temporary support material 24 and parts of the contacts 16. Although this step is performed preferably, by electrolysis, other techniques may be used such as, for example, electroless deposition. Techniques such as vacuum deposition or sputtering are not feasible since they are generally not suitable to achieve the necessary thickness of the temporary support material 24 and they subject the light-protected portions of the photoresist layer 20 to excessive heat which often causes chemical changes to occur, making it extremely difficult to subsequently remove these portions.

Figure 5:
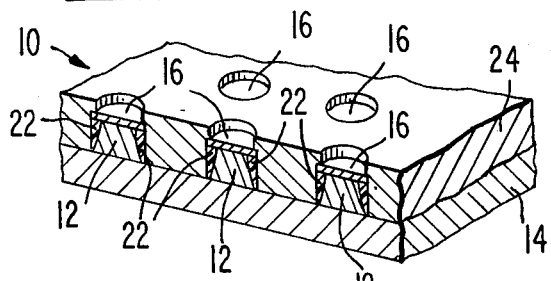
Figure 6:
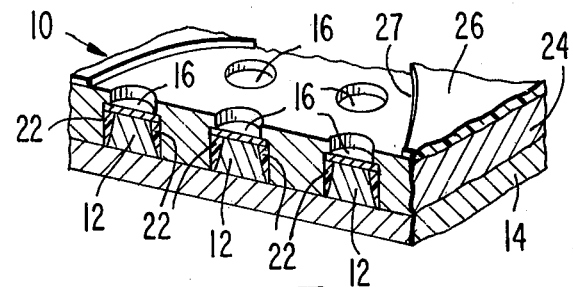

FIG. 5 illustrates the next step comprising removing the light-protected portions 23 of the photoresist layer 20 which lie above parts of the metallic contacts 14 by using a conventional photoresist remover, whereby the previously covered portions of the contacts 16 are exposed. A mask 26 having an opening 27 therein encompassing the exposed portions of the contacts 16 is now formed on the temporary support material 24, as shown in FIG. 6. This step is performed, preferably, by applying an additional layer of photoresist on the first layer 24 and forming in this additional photoresist layer, using conventional photolithographic processes, an opening therein encompassing the exposed portions of the contacts 16, whereby only a portion of the temporary support material 24 is left exposed.

Figure 7:
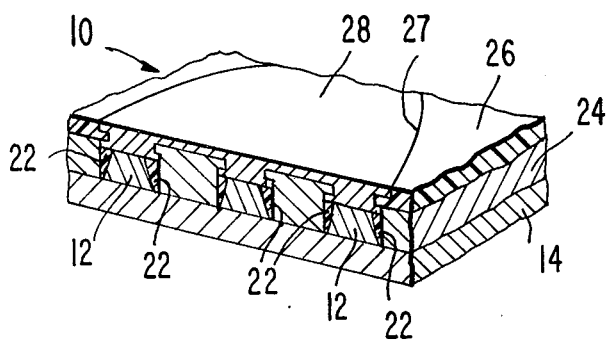

The metallic contacts 16 are next metallically interconnected by depositing on the exposed portion of the temporary support material 24 and on the exposed portions of the contacts 16 a continuous layer 28 of electrically-conductive material different from the temporary support material 24. Preferably, the electrically-conductive layer 28 is also metal and is deposited by electrolysis. Other techniques may be used such as, for example, electroless deposition. As mentioned above, whatever technique is chosen should be one which does not cause any chemical change in the light-protected portions 22 of the photoresist layer 20. This electrically-conductive layer 28 is, preferably, made of the same type metal as the contacts 16, which are gold in the present embodiment, and thus merges with the contacts 16 to form a homogeneous metallized bridge which electrically interconnects the elements 12 of the array as shown in FIG. 7.

Figure 8:
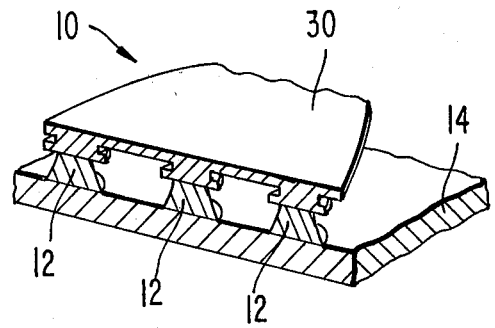

After depositing the electrically-conductive layer 28 through the opening in the mask 26, the present novel method is completed by removing the mask 26 and next removing the temporary support material 24, whereby the electrically-conductive layer 28 becomes a homogeneous metallized air-bridge, designated 30 in FIG. 8, interconnecting the elements 14. As mentioned above, the temporary support material 24 is, preferably, copper which is readily removed by etching in an ultrasonic etch bath of ferric chloride solution. The further step of removing the light-protected portions 22 of the photoresist layer 26 lying adjacent the elements 12 and under the edges of the metallic contacts 16 is now performed, leaving only the homogeneous metallized air-bridge 30 as shown in FIG. 8.

Figure 9:
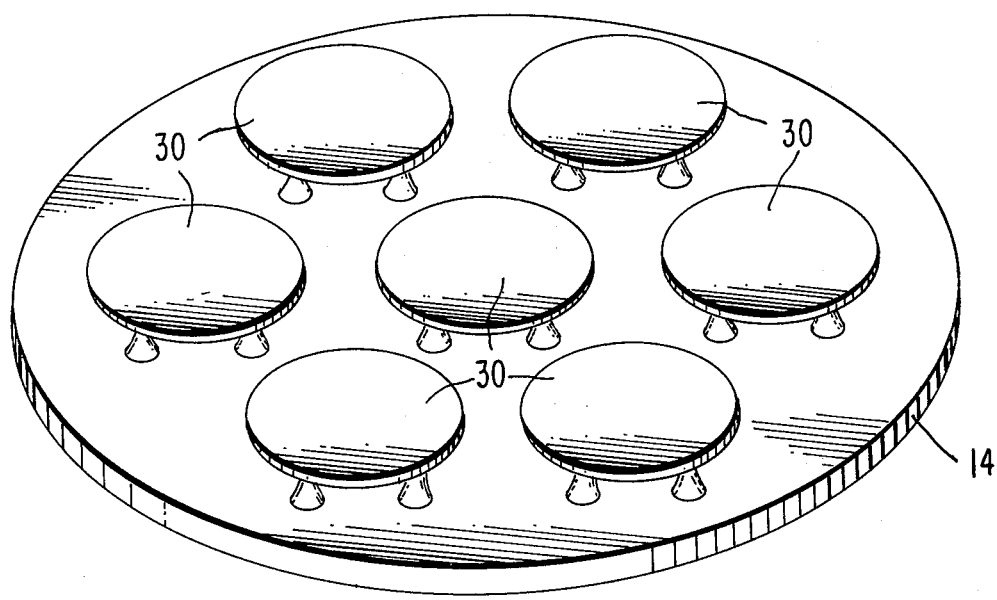
FIG. 9 is a perspective view illustrating a plurality of arrays, each of the elements of each array being interconnected by a metallized air-bridge.

The present novel method is particularly suitable for use in the mass production of arrays since a plurality of metallized air-bridges can be formed simultaneously, thereby achieving economies in production. Many separate and complete air-bridges 30, each one interconnecting the elements of a semiconductor array may be formed not only on a single substrate 14, as shown in FIG. 9, but also on batches of several substrates simultaneously. By applying, exposing and developing the layer 20 of photoresist prior to filling in the space above the substrate 14, the light-protected portions of the photoresist layer 20 protect the elements 12, especially the PN junctions, and parts of the contacts 16 from being exposed to the temporary support material 24. Otherwise, the temporary support material 24 might adversely affect the elements, for example, by seeping into exposed PN junctions, and may also contact and adhere strongly to the metallic contacts, making it difficult to effectively expose clean parts of the metallic contacts on which the layer of conductive material is deposited. As a result of this protective step in particular and the inherent reproducible uniformity of such a method in general, a high yield is obtained.

The present methods of electrically interconnecting the elements of an array minimizes the parasitic shunt capacitance of the array since the metallized air-bridges span an air dielectric. The resulting homogeneous bridge structure also serves as an integral heat capacitor for the elements while providing low inductance interconnections. Consequently, the present method is particularly applicable for interconnecting the elements of avalanche-diode arrays used for high power amplification such as, for example, those arrays operated in the Trappatt mode where one desires to achieve high power output efficiency while maintaining a broad bandwidth, wide pulse width, and high duty cycle.

What is claimed is:

1. A method of electrically interconnecting a plurality of spaced semiconductor elements adjacent to a substrate, each element having a mesa shape with a top surface spaced apart from said substrate and a side surface, comprising the steps of:
    coating the side surface of said elements with a protective material, filling in the space above said substrate and in between said elements with a temporary support material, depositing a continuous electrically-conductive layer on said support material and in electrical contact with the top surfaces of a plurality of said elements, and removing said temporary support material, whereby said electrically-conductive layer forms a homogeneous air-bridge electrically interconnecting a plurality of said elements.

2. A method as defined in claim 1 wherein said coating step is performed by:

applying a layer of photoresist on said substrate in contiguous surrounding relation to the sides of said elements.

exposing selectively said photoresist layer to light, which will allow portions of said photoresist layer lying adjacent to the sides of said elements to remain after a subsequent developing step, and developing said photoresist layer, whereby said portions of said photoresist layer lying adjacent and in contiguous surrounding relation to the sides of said elements remain.

3. A method as defined in claim 1 further comprising removing said protective material after said step of removing said temporary support material.

4. A method as defined in claim 2 wherein each of said elements has a cap of electrically-conductive material covering and extending beyond said top surface thereof, said photoresist is positive-acting, and said photoresist layer has a thickness at least slightly greater than the height of said caps above said substrate, said exposing step being performed by subjecting portions of said photoresist layer other than said portions lying adjacent to the sides of said elements to a collimated light source utilizing a dot-pattern mask of opaque dots overlying said caps, said dots being smaller than said caps, said developing step thereby leaving light-protected portions of said photoresist layer comprising not only portions of said photoresist layer lying adjacent said elements under edges of said caps but also portions lying above parts of said caps, said method further comprising removing said light-protected portions of said photoresist layer lying above parts of said caps whereby portions of said caps are exposed, next forming on said temporary support material, prior to said depositing step, a mask having an opening therein encompassing said exposed portions of said caps, whereby a portion of said temporary support material is exposed, and removing said mask after said depositing step.

5. A method as defined in claim 4 further comprising removing said light-protected portions of said photoresist layer lying adjacent said elements and under edges of said caps after said step of removing said temporary support material.

6. A method as defined in claim 4 wherein said forming step is performed by applying an additional layer of photoresist on said temporary support material and forming in said additional photoresist layer an opening therein encompassing said exposed portions of said caps.

7. A method as defined in claim 4 wherein said caps comprise metallic contacts, said substrate is metal, said temporary support material is metal and has a thickness at least equal to the height of said caps above said substrate, and wherein said filling step is performed by electroplating said temporary support material on said substrate.

8. A method as defined in claim 7 wherein said electrically-conductive layer is metal and wherein said depositing step is performed by electroplating said layer.

9. A method as defined in claim 8 wherein said substrate, said metallic contacts, and said electricallyconductive layer are gold, and wherein said temporary suppport material is copper.

10. A method as defined in claim 9 wherein said step of removing said copper is performed by etching said copper in an ultrasonic etch bath of ferric chloride solution.

* * * * *